United States Patent
Hong et al.

(10) Patent No.: US 8,263,449 B2
(45) Date of Patent: Sep. 11, 2012

(54) METHOD OF MANUFACTURING HIGH ELECTRON MOBILITY TRANSISTOR

(75) Inventors: Ki-ha Hong, Cheonan-si (KR); U-In Chung, Seoul (KR); Jai-kwang Shin, Anyang-si (KR); Jae-joon Oh, Seongnam-si (KR); Jong-seob Kim, Hwaseong-si (KR); Hyuk-soon Choi, Hwaseong-si (KR); In-jun Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/017,361

(22) Filed: Jan. 31, 2011

(65) Prior Publication Data

US 2011/0212582 A1    Sep. 1, 2011

(30) Foreign Application Priority Data

Feb. 26, 2010   (KR) .................. 10-2010-0018068

(51) Int. Cl.
   *H01L 21/338*   (2006.01)
(52) U.S. Cl. . 438/172; 257/194; 257/196; 257/E29.246; 257/E29.247; 257/E21.403; 257/E21.407
(58) Field of Classification Search .............. 257/194, 257/196, E29.246, E29.247, E21.403, E21.407; 438/172
See application file for complete search history.

(56) References Cited

U.S. PATENT DOCUMENTS

| 5,250,822 A | 10/1993 | Sonoda et al. |
| 5,550,388 A * | 8/1996 | Haruyama ................. 257/24 |
| 8,044,432 B2 | 10/2011 | Chen et al. |
| 2002/0000570 A1 * | 1/2002 | Nakajima et al. ........... 257/192 |
| 2003/0183844 A1 * | 10/2003 | Yokoyama et al. ........... 257/192 |

FOREIGN PATENT DOCUMENTS

| JP | 10335638 A | 12/1998 |
| KR | 19910023901 B1 | 6/1995 |
| KR | 2003-0023742 | 3/2003 |
| KR | 20030056332 A | 7/2003 |
| KR | 20030081596 A | 10/2003 |
| KR | 20070092482 A | 9/2007 |

* cited by examiner

*Primary Examiner* — Asok Sarkar
(74) *Attorney, Agent, or Firm* — Harness, Dickey & Pierce, P.L.C.

(57) ABSTRACT

A method of manufacturing a High Electron Mobility Transistor (HEMT) may include forming first and second material layers having different lattice constants on a substrate, forming a source, a drain, and a gate on the second material layer, and changing the second material layer between the gate and the drain into a different material layer, or changing a thickness of the second material layer, or forming a p-type semiconductor layer on the second material layer. The change in the second material layer may occur in an entire region of the second material layer between the gate and the drain, or only in a partial region of the second material layer adjacent to the gate. The p-type semiconductor layer may be formed on an entire top surface of the second material layer between the gate and the drain, or only on a partial region of the top surface adjacent to the gate.

12 Claims, 6 Drawing Sheets

METHOD OF MANUFACTURING HIGH ELECTRON MOBILITY TRANSISTOR

CROSS-REFERENCE TO RELATED APPLICATION

This application claims priority under 35 U.S.C. §119 to Korean Patent Application No. 10-2010-0018068, filed on Feb. 26, 2010 with the Korean Intellectual Property Office, the disclosure of which is incorporated herein in its entirety by reference.

BACKGROUND

1. Field

The present disclosure relates to methods of manufacturing a transistor, for instance, a method of manufacturing a High Electron Mobility Transistor (HEMT).

2. Description of the Related Art

A conventional High Electron Mobility Transistor (HEMT) includes an aluminum gallium nitride (AlGaN) layer and a gallium nitride (GaN) layer as main layers. Instead of chemical doping, modulation doping is applied to the HEMT using a polarization field generated by spontaneous polarization and piezo polarization. As a result of the modulation doping, a two-dimensional electron gas (2DEG) is generated in the GaN layer adjacent to an interface of the AlGaN layer and the GaN layer. The generated 2DEG may be used as an n-channel.

A conventional HEMT is formed by removing a 2DEG between a gate and a drain and by extending a distance between the gate and the drain. The HEMT may be used as a high voltage transistor. However, when considering integrity, there is a limit to the extension of the distance between the gate and the drain. Also, due to the characteristics of a semiconductor material, an electric field may be concentrated on the gate as the 2DEG between the gate and the drain is removed. Accordingly, the gate and intensity of the electric field near the gate may be greater than a breakdown voltage.

To address this electric field concentration issue, a HEMT using a field plate has been introduced. By using the field plate, the electric field that is concentrated on the gate may be partially dispersed. However, increasing the size of the field plate does not result in a continuous increase in the effect of the field plate. Also, with respect to the distribution of the electric field, although a peak may be relatively small when the field plate is present, the peak nevertheless exists, and the distribution of the electric field is not uniform.

It is possible to reduce the electric field concentration on the gate by p-doping or implanting ions into the interface of the AlGaN layer and the GaN layer. However, although the difference between a reference concentration and the p-doping concentration or the ion implantation concentration is relatively small, the breakdown voltage may greatly vary. Also, on-current reduction may also be relatively large. That is, a process window is relatively small with respect to the p-doping operation or the ion implantation. Thus, it is difficult to control the p-doping operation or the ion implantation and to ensure the reliability of the p-doping operation or the ion implantation.

SUMMARY

Example embodiments of the present invention relate to methods of manufacturing a High Electron Mobility Transistor (HEMT) so as to increase a breakdown voltage. Additional aspects of the methods will be set forth in part the description which follows and, in part, will be apparent from the description or may be better appreciated upon practice of the non-limiting embodiments herein.

A method of manufacturing a High Electron Mobility Transistor (HEMT) according to a non-limiting embodiment of the present invention may include forming a first material layer on a substrate; forming a second material layer on the first material layer, wherein the second material layer has a different lattice constant from the first material layer; forming a source, a drain, and a gate on the second material layer; and changing at least a portion of the second material layer between the gate and the drain into a different material layer. An entire region of the second material layer between the gate and the drain, or only a partial region of the second material layer adjacent to the gate, may be changed into the different material layer.

In order to change the portion of the second material layer into the different material layer, the method may further involve forming a mask that exposes the second material layer between the gate and the drain; implanting different materials (e.g., doping materials) in an exposed region of the second material layer to form an implanted region; and annealing the implanted region. When the mask is formed, an entire region of the second material layer between the gate and the drain may be exposed, or only a partial region of the second material layer adjacent to the gate may be exposed. The different materials for implantation may include at least one of indium (In), phosphorus (P), argon (Ar), oxygen (O), magnesium (Mg), and beryllium (Be).

A method of manufacturing a High Electron Mobility Transistor (HEMT) according to another non-limiting embodiment of the present invention may include forming a first material layer on a substrate; forming a second material layer on the first material layer, wherein the second material layer has a different lattice constant from the first material layer; forming a source, a drain, and a gate on the second material layer; and changing a thickness of the second material layer between the gate and the drain.

In order to change the thickness of the second material layer, the second material layer between the gate and the drain may be etched. Also, in order to change the thickness of the second material layer, a portion of the second material layer between the gate and the drain may be changed into a different material from the second material layer. For example, the different material may include an oxide layer. In order to change the portion of the second material layer into a different material, that portion of the second material layer may be treated with a plasma that includes oxygen.

A method of manufacturing a High Electron Mobility Transistor (HEMT) according to another non-limiting embodiment of the present invention may include forming a first material layer on a substrate; forming a second material layer on the first material layer, wherein the second material layer has a different lattice constant from the first material layer; forming a source, a drain, and a gate on the second material layer; and forming a p-type semiconductor layer on the second material layer between the gate and the drain.

BRIEF DESCRIPTION OF THE DRAWINGS

The above and/or other aspects of the non-limiting embodiments of the present invention may be better appreciated when the following description is taken in conjunction with the accompanying drawings of which.

DETAILED DESCRIPTION

Figure 1:
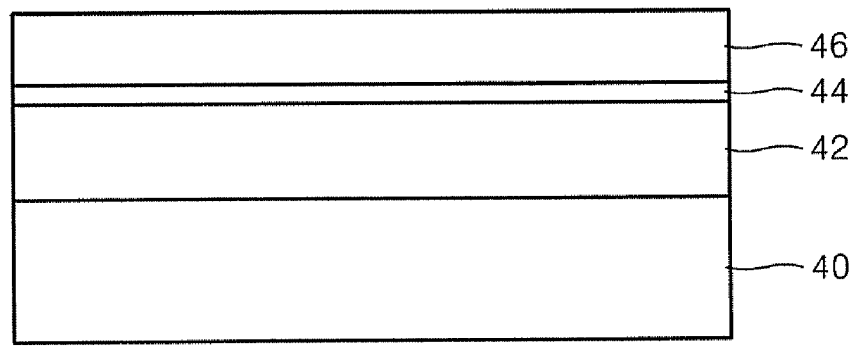
FIGS. 1 through 8 are cross-sectional views illustrating methods of manufacturing a High Electron Mobility Transistor (HEMT) according to non-limiting embodiments of the present invention.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, methods of manufacturing a High Electron Mobility Transistor (HEMT) according to non-limiting embodiments of the present invention will be described in further detail with reference to the attached drawings. In the drawings, the thicknesses of layers and regions may have been exaggerated for clarity.

Referring to FIG. 1, first and second material layers 42 and 46 are stacked on a substrate 40. The substrate 40 may be a silicon substrate or a sapphire substrate. The first and second material layers 42 and 46 may be semiconductor layers having different lattice constants. In a non-limiting embodiment, the lattice constant of the first material layer 42 may range from about 3.198-3.59 Å. For example, the first material layer 42 may be a gallium nitride (GaN) layer or an indium gallium nitride (InGaN) layer. The second material layer 46 is a semiconductor layer having a lattice constant that is less than that of the first material layer 42. For example, the second material layer 46 may be an aluminum gallium nitride (AlGaN) layer. Because of a difference between the lattice constants of the first and second material layers 42 and 46, polarization may occur in the second material layer 46. Due to the polarization, a negative charge (−) may be generated in the first material layer 42 adjacent to an interface between the first material layer 42 and the second material layer 46. The negative charge (−) is a two-dimensional electron gas (2DEG). Although the 2DEG is not a layer like the material layers, for convenience of description, the 2DEG is denoted by reference numeral 44 in FIG. 1.

Figure 2:
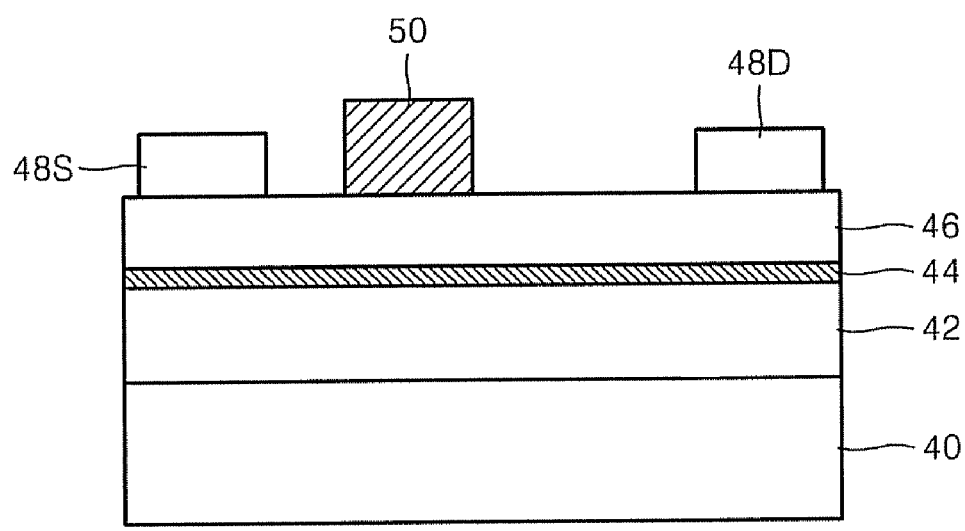

Referring to FIG. 2, a source 48S and a drain 48D are formed on the second material layer 46. The source 48S and the drain 48D are separated from each other and may be formed of the same material or different materials. For example, the source 48S and the drain 48D may be formed of titanium aluminum (TiAl) or nickel gold (NiAu). The source 48S and the drain 48D may form an ohmic contact with the second material layer 46. A gate 50 is formed on the second material layer 46 between the source 48S and the drain 48D. The gate 50 may be formed of Ni/Au. The gate 50 may form a Schottky contact with the second material layer 46. The gate 50, the source 48S, and the drain 48D may form a single layer or multiple layers. The order of forming the source 48S, the drain 48D, and the gate 50 may also be reversed. For instance, the gate 50 may be formed prior to forming the source 48S and the drain 48D. Furthermore, although the gate 50 is illustrated as being closer to the source 48S, it should be understood that example embodiments are not necessarily limited to the spacing shown.

Figure 3:
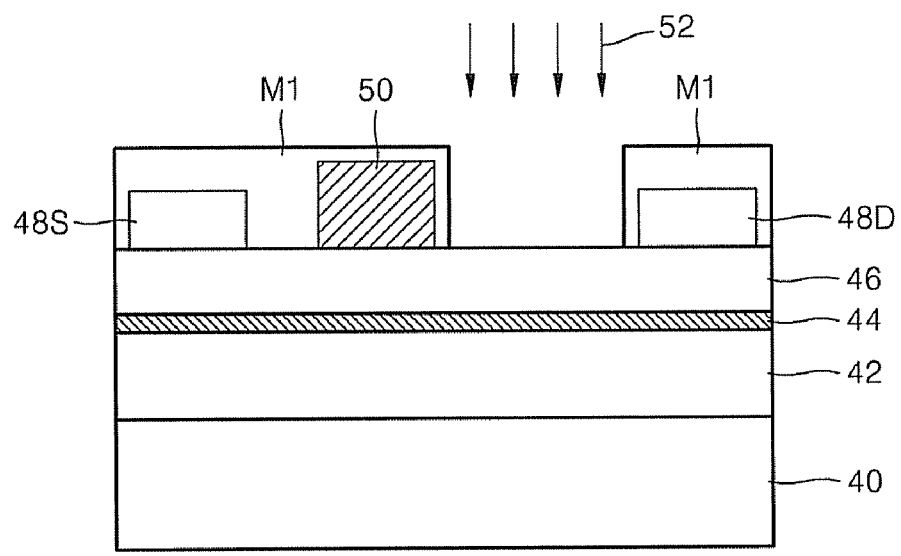

As illustrated in FIG. 3, a mask M1 is formed on the second material layer 46 so as to cover the source 48S, the drain 48D, and the gate 50. The mask M1 may include a photo resist pattern. The mask M1 is formed in such a manner that a top surface of the second material layer 46 between the gate 50 and the drain 48D is exposed. For example, the top surface of the second material layer 46 between the gate 50 and the drain 48D may be partially or completely exposed. With regard to partial exposure, it may be just the region of the second material layer 46 adjacent to the gate 50 that is exposed, although example embodiments are not limited thereto. After forming the mask M1, different materials (e.g., doping materials) are implanted in the exposed top surface of the second material layer 46 (refer to reference numeral 52 in FIG. 3). After the implantation of the different materials, the mask M1 is removed. For uniform diffusion of the different materials, the resultant region including the implanted different materials may be annealed. The annealing operation may be performed for about 10 minutes at a temperature in the range of about 400° C. to about 500° C. The annealing operation may be performed in a furnace or a rapid thermal annealing (RTA) device.

Figure 4:
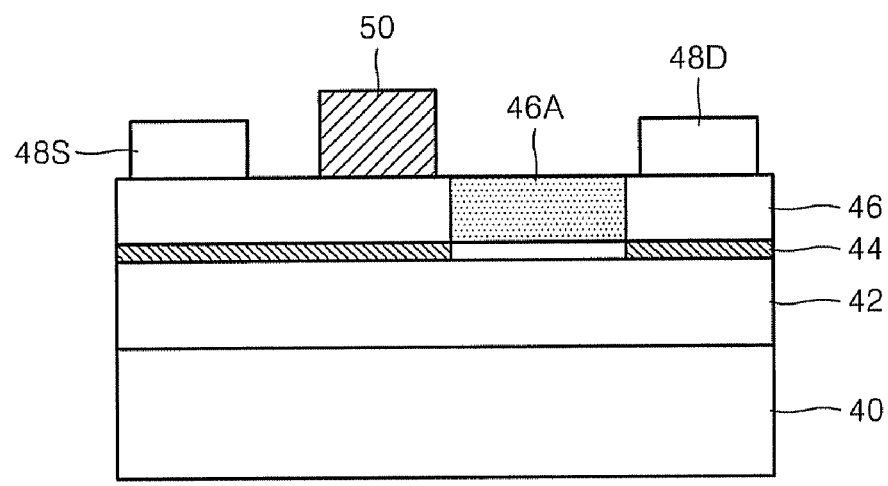

As illustrated in FIG. 4, by implanting and annealing the different materials, the second material layer 46 between the gate 50 and the drain 48D becomes a material layer 46A including the different materials (hereinafter, referred to as a different material layer). A material configuration of the different material layer 46A includes a material forming the second material layer 46 and the different materials implanted in the process described in relation to FIG. 3. For example, when the second material layer 46 is a AlGaN layer, the different material layer 46A may be a XAlGaN layer. Here, X represents the different material(s) implanted in the process described in relation to FIG. 3. The different materials X may include group III elements or group V elements of the periodic table. The group III elements may include indium (In). The group V elements may include phosphorus (P). Also, the different materials X may include an inert gas such as argon (Ar).

As a result of the different materials X, a lattice of the different material layer 46A may be deformed. For example, a lattice constant of the different material layer 46A may be increased by the different materials X. Accordingly, a lattice constant difference between the different material layer 46A and the first material layer 42 may be decreased such that piezo polarization is reduced. Consequently, the stress due to the lattice constant difference between the different material layer 46A and the first material layer 42 is less than in the case involving the second material layer 46 and the first material layer 42. As a result, the different materials X function to decrease stress due to a lattice constant difference.

When the different materials X are Ar, polarization charges may be decreased due to lattice deformation. By doing so, the 2DEG 44 below the different material layer 46A may be reduced. Because the stress due to the lattice constant difference between the different material layer 46A and the first material layer 42 is less than the case involving the second material layer 46 and the first material layer 42, the polarization occurring in the different material layer 46A is relatively small compared to the polarization occurring in the second material layer 46. Thus, the 2DEG 44 of the different material layer 46A is less than the case involving the second material layer 46. As a result, a lightly doped drain (LDD) region is formed on the second material layer 46 between the gate 50 and the drain 48D. In FIG. 4, for convenience of reference, a decrease in a 2DEG is illustrated as a lighter region of the 2DEG 44.

As discussed above, a region of the different material layer 46A may be defined by the mask M1 of FIG. 3. For instance, if the mask M1 is formed in such a manner that the second material layer 46 between the gate 50 and the drain 48D is partially exposed instead of being completely exposed, then the different material layer 46A will not be the entire region of the second material layer 46 between the gate 50 and the drain 48D but, instead, will just be a partial region of the second material layer 46 therebetween (e.g., a partial region adjacent to the gate 50). The different material layer 46A may be an alloy layer including the different materials X as one of the configuring elements. Alternatively, the different material layer 46A may just be a material layer that simply includes the different materials X.

Furthermore, the different materials X implanted in the process described in relation to FIG. 3 may be a p-type doping material. The p-type doping material may be a material having a different valence from a material forming the second material layer 46. For example, the p-type doping material may include fluorine (F), oxygen (O), magnesium (Mg), beryllium (Be), or other similar elements for p-type doping. The p-type doping material may directly react with the 2DEG and, thus, may reduce the 2DEG. As described above, the different material layer 46A reduces the 2DEG 44 therebelow. Thus, a breakdown voltage of a HEMT including the different material layer 46A is increased.

Figure 5:
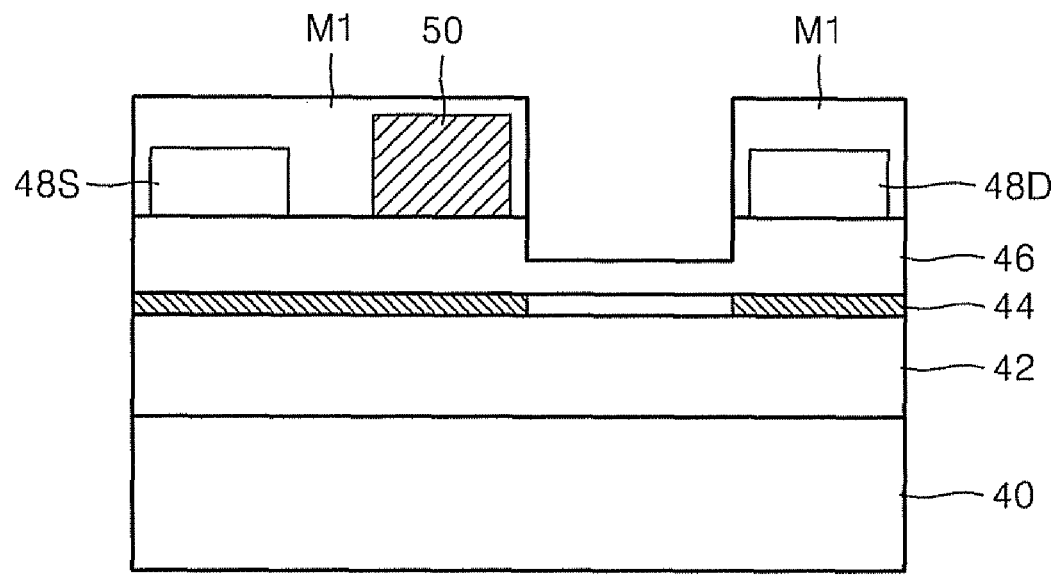

As illustrated in FIG. 5, according to another non-limiting embodiment of the present invention, a mask M1 may be formed as described in relation to FIG. 3 followed by the etching of an exposed region of the second material layer 46. By performing the etching operation, a thickness of the exposed region of the second material layer 46 becomes thinner than that of the non-exposed regions of the second material layer 46. Polarization of the exposed region of the second material layer 46 having the lesser thickness is also decreased. Thus, as illustrated in FIG. 5, the 2DEG 44 below the exposed region of the second material layer 46 having the lesser thickness is reduced. In the etching operation, the thickness of the exposed region of the second material layer 46 is decreased in such a manner that a density of the 2DEG 44 below the exposed region ranges from about $1 \times 10^{17}/cm^3$-$5 \times 10^{18}/cm^3$. Although the different material layer 46A is formed, it is still possible to obtain a sufficient on-current by maintaining the value of the density of the 2DEG 44 below the exposed region. The etching operation may be performed on an entire top surface of the exposed region of the second material layer 46 or just on a partial region of the top surface adjacent to the gate 50.

Figure 6:
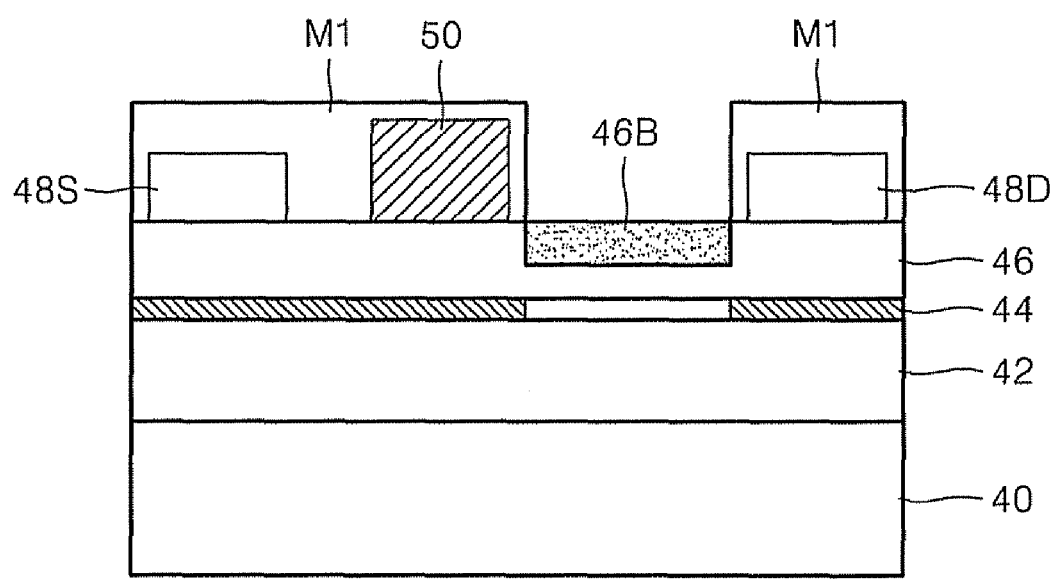

As illustrated in FIG. 6, according to another non-limiting embodiment of the present invention, after the mask M1 is formed in the process described in relation to FIG. 3, a plasma treatment is performed on an exposed region of the second material layer 46. The plasma may include oxygen. Due to the plasma treatment, the exposed region of the second material layer 46 becomes an oxide layer 46B. For example, when the second material layer 46 is formed of AlGaN, the exposed region of the second material layer 46 may become an AlO layer due to the plasma treatment. The plasma treatment may be performed until a portion of the exposed region of the second material layer 46 becomes an oxide layer 46B of a predetermined thickness.

Because of the oxide layer 46B formed by the plasma treatment, a thickness of the exposed region of the second material layer 46 becomes thinner, and a proportion of the aluminum in the exposed region of the second material layer 46 is decreased. Thus, polarization of the exposed region of the second material layer 46 is reduced so that the 2DEG 44 below the exposed region is also reduced. As a result, a breakdown voltage of a HEMT may be increased. In sum, a plasma treatment may be performed to adjust the thickness of the oxide layer 46B so as to attain a desired value of the density of the 2DEG 44 below the oxide layer 46B. The plasma treatment may be performed on an entire top surface of the exposed region or just on a partial region of the top surface adjacent to the gate 50.

Figure 7:
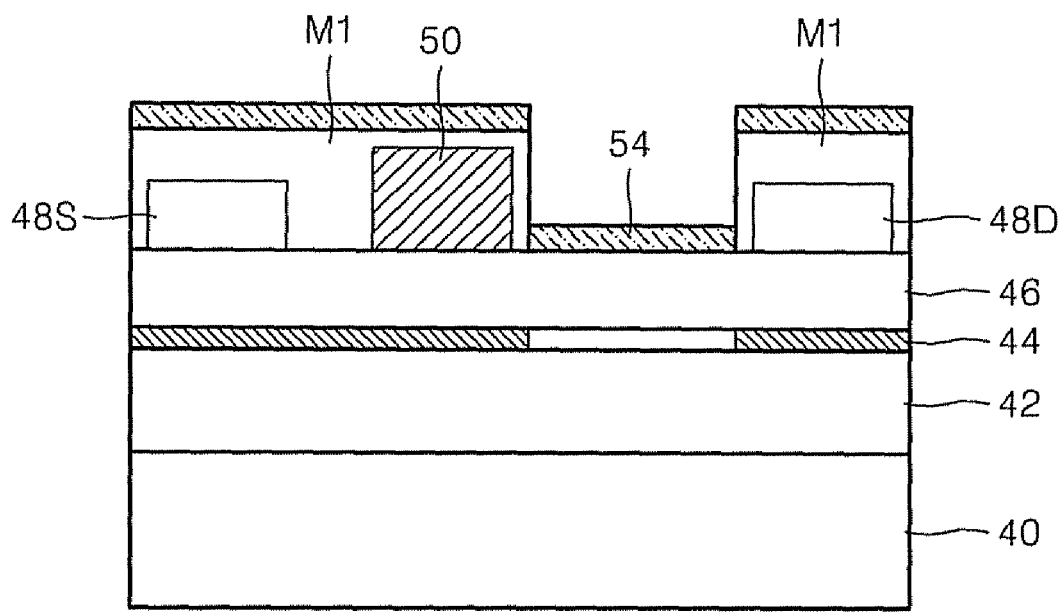

As illustrated in FIG. 7, according to another non-limiting embodiment of the present invention, after the mask M1 is formed in the process described in relation to FIG. 3, a p-type material layer 54 is deposited on a top surface of the exposed region of the second material layer 46. The p-type material layer 54 may be a p-type semiconductor layer. The p-type semiconductor layer may be a p-type compound semiconductor layer (e.g., p-GaN layer, a p-NiO layer). In a process in which the p-type material layer 54 is formed, the p-type material layer 54 is formed on the mask M1. The p-type material layer 54 formed on the mask M1 is removed together with the mask M1 in a process for removing the mask M1.

Figure 8:
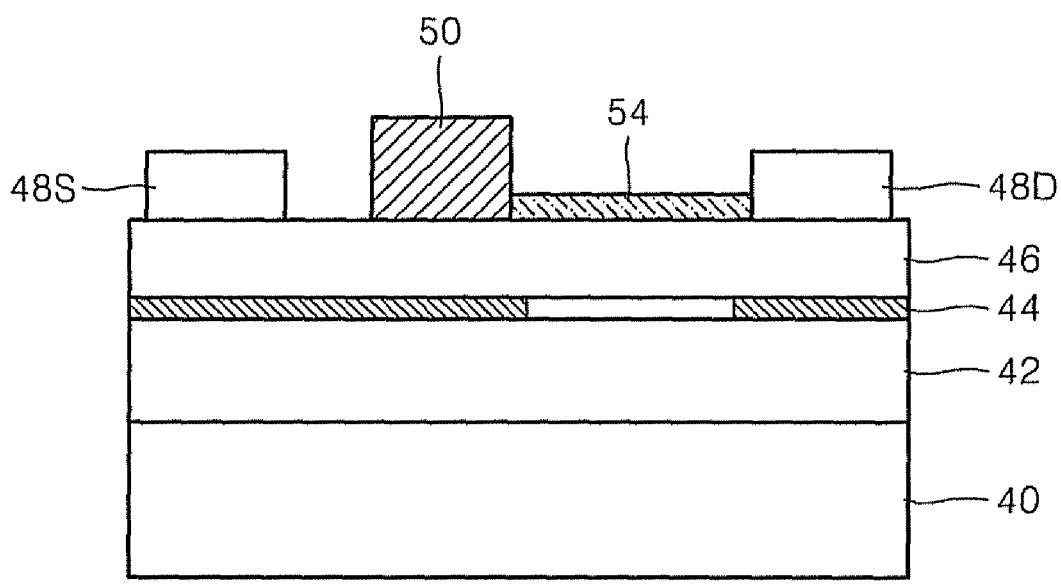

FIG. 8 illustrates a situation in which the p-type material layer 54 exists only on the exposed region of the second material layer 46 after the p-type material layer 54 formed on the mask M1 is removed together with the mask M1. Since the p-type material layer 54 exists on the exposed region of the second material layer 46, the 2DEG 44 below the exposed region may be offset. In such a case, in order to attain the desired value of the density of the 2DEG 44 below the exposed region, a thickness of the p-type material layer 54 may be adjusted when the p-type material layer 54 is formed, or a thickness of the second material layer 46 may be adjusted when the second material layer 46 is formed. Also, the p-type material layer 54 may be formed on an entire top surface of the exposed region or just on a partial region of the top surface adjacent to the gate 50. Furthermore, although the p-type material layer 54 in FIG. 8 is illustrated as fully occupying the space between the gate 50 and the drain 48D, it should be understood that the p-type material layer 54 may be alternatively disposed so as not to contact the gate 50 and the drain 48D.

Although not expressly shown in the drawings, it should be understood that various combinations of the non-limiting embodiments described above may be implemented. For instance, in combination with the etching performed in FIG. 5, the implantation process of FIG. 3, the plasma treatment of FIG. 6, and/or the p-type material deposition of FIG. 8 may be employed in connection with the exposed region of the second material layer 46. According to the non-limiting embodiments described herein, the 2DEG 44 below the exposed region of the second material layer 46 is reduced such that a LDD region is formed between the gate 50 and the drain 48D. By forming the LDD region between the gate 50 and the drain 48D, it is possible to reduce or prevent an electric field being concentrated on an edge of the gate 50 toward the drain 48D. Thus, it is possible to increase the breakdown voltage. Also, since it is possible to obtain a sufficient process margin with respect to the formation of the LDD region, reliability may be improved.

Figure 9:
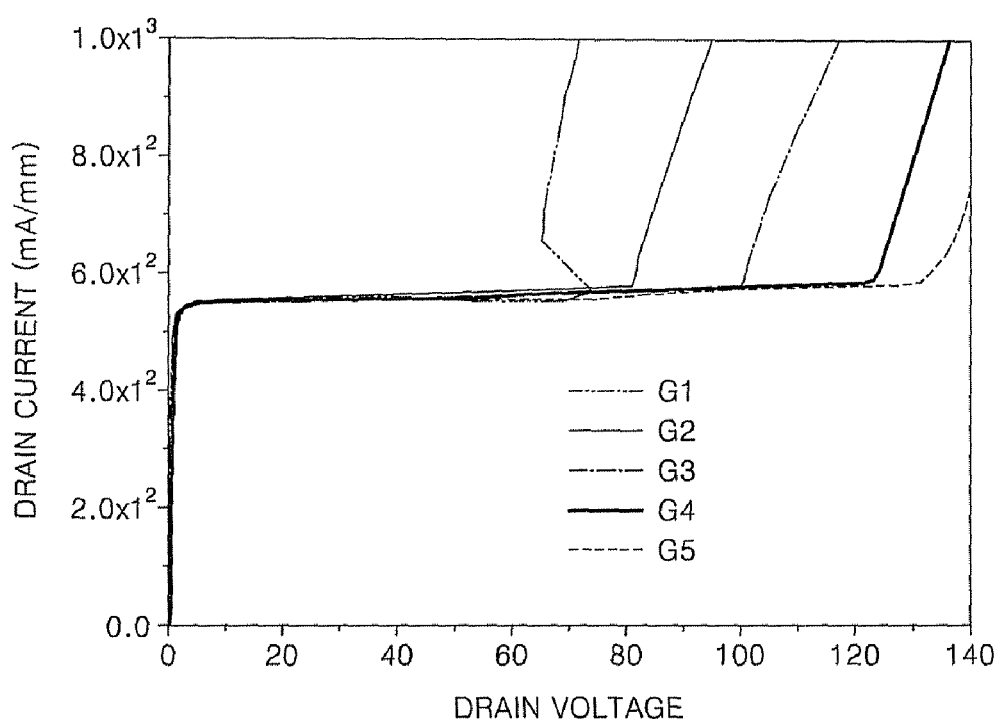
FIG. 9 is a graph illustrating a breakdown voltage characteristic (a drain current-drain voltage characteristic) with respect to a length of a lightly doped drain (LDD) region forming unit, wherein the length is measured from a gate when the region forming unit is formed on a second material layer between the gate and a drain according to non-limiting embodiments of the present invention.

FIG. 9 is a graph illustrating a breakdown voltage characteristic (a drain current-drain voltage characteristic) with respect to a length of an LDD region forming unit, wherein the length is measured from the gate 50 when the region forming unit is formed on the second material layer 46 between the gate 50 and the drain 48D according to non-limiting embodiments of the present invention. In FIG. 9, first through fifth graphs G1, G2, G3, G4, and G5 show the breakdown voltage characteristic when the length ranges from 1 through 5 μm, respectively. Referring to the first through fifth graphs G1 through G5, it is apparent that the breakdown voltage characteristic is increased as the lengths become larger.

Figure 10:
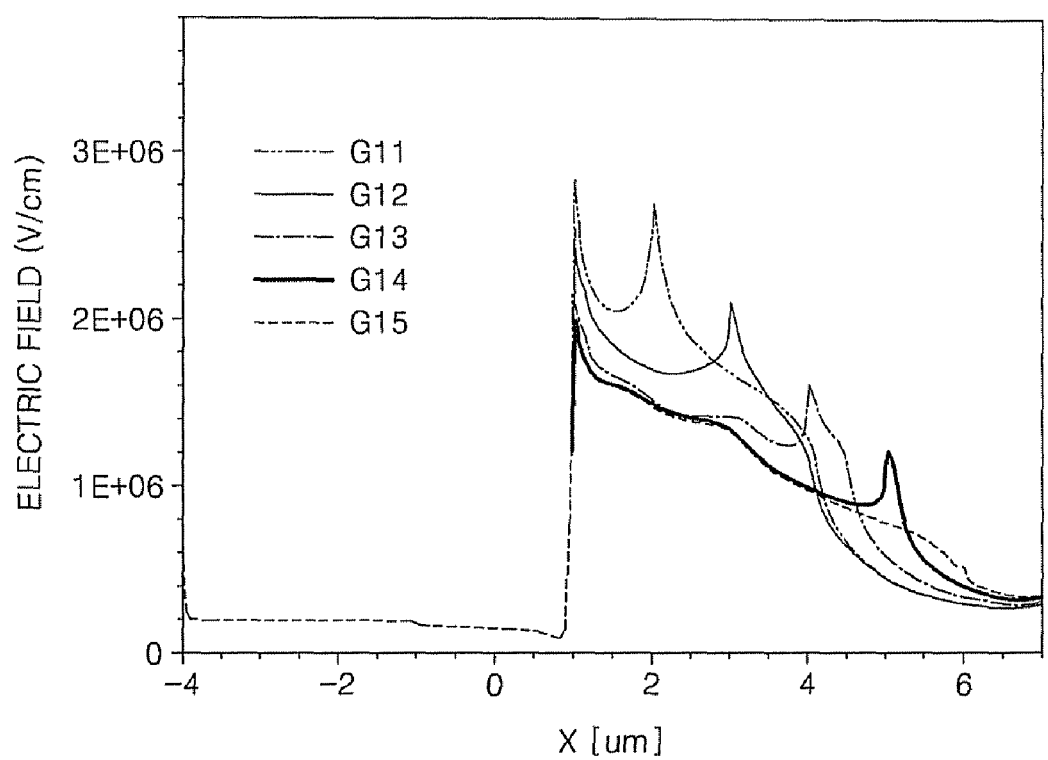
FIG. 10 is a graph illustrating the distribution of an electric field (between a gate and a drain when a drain voltage $V_d$ is 430 V) with respect to a length of the LDD region forming unit, wherein the length is measured from the gate when the region forming unit is formed on a second material layer between the gate and the drain according to non-limiting embodiments of the present invention.

FIG. 10 is a graph illustrating the distribution of an electric field (between the gate 50 and the drain 48D when a drain voltage $V_d$ is 430 V) with respect to the length of the LDD region forming unit, wherein the length is measured from the gate 50 when the region forming unit is formed on the second material layer 46 between the gate 50 and the drain 48D according to non-limiting embodiments of the present invention. First through fifth graphs G11, G12, G13, G14, and G15 indicate the distribution of the electric field when the length of the LDD region forming unit ranges 1 through 5 μm, respectively. Comparing each of the first through fifth graphs G11, G12, G13, G14, and G15, it is apparent that the electric field at an edge of the gate 50 toward the drain 48D decreases as the length of the LDD region forming unit increases. Also, it is apparent that the distribution of the electric field becomes more uniform as the length increases.

With reference to the aforementioned results, it can be appreciated that the on-current is not reduced without an increase in a surface roughness of the second material layer 46 between the gate 50 and the drain 48D. As described above in accordance with non-limiting embodiments of the present invention; it is possible to obtain a sufficient process margin with respect to the formation of the LDD region. Thus, reliability may be improved.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims. For instance, the descriptions of features or aspects within each embodiment should typically be considered as available for other similar features or aspects in other embodiments.

What is claimed is:

1. A method of manufacturing a High Electron Mobility Transistor (HEMT), the method comprising:
   forming a first material layer on a substrate;
   forming a second material layer on the first material layer, the second material layer having a lattice constant different from that of the first material layer;
   forming a source contact, a drain contact, and a gate contact on the second material layer; and changing at least a portion of the second material layer between the gate and the drain into a different material layer,
   wherein the source contact, the drain contact, and the gate contact directly contact the second material layer.

2. The method of claim 1, wherein an entire region of the second material layer between the gate contact and the drain contact or a partial region of the second material layer adjacent to the gate contact is changed into the different material layer.

3. The method of claim 1, wherein the changing at least a portion of the second material layer comprises:
   forming a mask that exposes the second material layer between the gate contact and the drain contact;
   implanting a doping material in an exposed region of the second material layer to form an implanted region; and
   annealing the implanted region.

4. The method of claim 3, wherein the forming a mask comprises exposing an entire region of the second material layer between the gate contact and the drain contact or exposing only a partial region of the second material layer adjacent to the gate contact.

5. The method of claim 3, wherein the doping material is at least one of indium (In), phosphorus (P), and argon (Ar).

6. The method of claim 3, wherein the doping material is at least one of oxygen (O), magnesium (Mg), and beryllium (Be).

7. A method of manufacturing a High Electron Mobility Transistor (HEMT), the method comprising:
   forming a first material layer on a substrate;
   forming a second material layer on the first material layer, the second material layer having a lattice constant different from that of the first material layer;
   forming a source contact, a drain contact, and a gate contact on the second material layer; and
   after forming the gate contact, changing a thickness of the second material layer between the gate contact and the drain contact,
   wherein the source contact, the drain contact and the gate contact directly contact the second material layer.

8. The method of claim 7, wherein the changing a thickness of the second material layer comprises etching the second material layer between the gate contact and the drain contact.

9. The method of claim 7, wherein the changing a thickness of the second material layer comprises changing a portion of the second material layer between the gate contact and the drain contact into a different material.

10. The method of claim 9, wherein the different material includes an oxide.

11. The method of claim 9, wherein the changing a portion of the second material layer comprises treating the portion of the second material layer with a plasma that includes oxygen.

12. A method of manufacturing a High Electron Mobility Transistor (HEMT), the method comprising:
   forming a first material layer on a substrate;
   forming a second material layer on the first material layer, the second material layer having a lattice constant different from that of the first material layer;
   forming a source contact, a drain contact, and a gate contact on the second material layer; and
   forming a p-type semiconductor layer on the second material layer between the gate contact and the drain contact,
   wherein the source contact, the drain contact and the gate contact directly contact the second material layer.

* * * * *